(12) United States Patent
Chou et al.

(10) Patent No.: US 11,641,005 B2
(45) Date of Patent: May 2, 2023

(54) LIGHT-EMITTING ELEMENT AND MANUFACTURING METHOD THEREOF

(71) Applicant: EPISTAR CORPORATION, Hsinchu (TW)

(72) Inventors: Yi-Lun Chou, Hsinchu (TW); Chih-Hao Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 172 days.

(21) Appl. No.: 17/328,732

(22) Filed: May 24, 2021

(65) Prior Publication Data

US 2021/0280745 A1  Sep. 9, 2021

Related U.S. Application Data

(62) Division of application No. 16/249,646, filed on Jan. 16, 2019, now Pat. No. 11,050,000.

(30) Foreign Application Priority Data

Jan. 19, 2018 (TW) .................. 107102115

(51) Int. Cl.
| | |
|---|---|
| *H01L 33/32* | (2010.01) |
| *H01L 21/78* | (2006.01) |
| *H01L 31/18* | (2006.01) |
| *H01L 33/00* | (2010.01) |
| *H01L 33/36* | (2010.01) |
| *H01L 33/24* | (2010.01) |
| *H01L 33/40* | (2010.01) |
| *H01L 33/44* | (2010.01) |

(52) U.S. Cl.
CPC .............. *H01L 33/32* (2013.01); *H01L 21/78* (2013.01); *H01L 31/1876* (2013.01); *H01L 33/0075* (2013.01); *H01L 33/24* (2013.01); *H01L 33/36* (2013.01); *H01L 33/40* (2013.01); *H01L 33/44* (2013.01)

(58) Field of Classification Search
CPC ..... H01L 33/32; H01L 33/0075; H01L 33/24; H01L 33/36; H01L 33/40; H01L 33/44; H01L 33/007; H01L 33/12; H01L 33/20; H01L 21/78; H01L 41/338; H01L 31/1876; H01S 5/0201
See application file for complete search history.

(56) References Cited

U.S. PATENT DOCUMENTS

2002/0197841 A1* 12/2002 Nagai .................. H01L 33/007
257/E21.127
2012/0241793 A1   9/2012 In et al.
(Continued)

FOREIGN PATENT DOCUMENTS

CN        1218997 A      6/1999

*Primary Examiner* — Thanhha S Pham
(74) *Attorney, Agent, or Firm* — Patterson + Sheridan, LLP (57) ABSTRACT

A method of manufacturing a light-emitting element includes: providing a substrate, wherein the substrate includes a top surface with a first area and a second area; introducing a semiconductor material to form a first layer on the first area and a second layer on the second area, wherein the first layer includes a first crystal quality and the second layer includes a second crystal quality, the first crystal quality is different from the second crystal quality; and dicing the substrate along the second area.

20 Claims, 8 Drawing Sheets

(56) References Cited

U.S. PATENT DOCUMENTS

2012/0248457 A1 10/2012 Hanawa et al.
2013/0181219 A1 7/2013 Fang et al.
2014/0209923 A1 7/2014 Xie et al.
2019/0280158 A1 9/2019 Sung et al.

* cited by examiner

LIGHT-EMITTING ELEMENT AND MANUFACTURING METHOD THEREOF

CROSS-REFERENCE TO RELATED APPLICATIONS

This application is a divisional application of U.S. patent application Ser. No. 16/249,646, filed on Jan. 16, 2019, which claims priority to and the benefit of Taiwan Patent Application No. 107102115 filed on Jan. 19, 2018, and the content of which is incorporated by reference in its entirety.

BACKGROUND

Technical Field

The present application relates to a light-emitting element and a manufacturing method thereof, more particularly, to an ultraviolet light-emitting element and the manufacturing method thereof.

Description of the Related Art

A method of manufacturing a nitride light-emitting diode which emits blue light includes forming single crystalline nitride semiconductors on a substrate for epitaxial growth, such as a sapphire substrate, by metal organic chemical vapor deposition (MOCVD).

However, due to the lattice mismatch between the nitride semiconductor and the substrate, there is often stress generated that causes defects in the epitaxially grown nitride semiconductor layers, thereby roughing the surface of the nitride semiconductor layers. As the semiconductor layers keep epitaxially growing, the stress is increased and the surface of the nitride semiconductor layer becomes rougher. Therefore, a buffer layer and a stress release layer are grown on the substrate before forming the light-emitting stack to improve quality of the semiconductor layers and reduce the defects.

Recently, ultraviolet light-emitting diodes (UV LEDs) have been gradually applied to various applications such as photo-curing, photo-lithography, water purification, and medical treatment. Ultraviolet light refers to light or radiation with a wavelength less than 400 nm. The epitaxial growth method of the UV LED is similar to that of the blue LED. The main difference is that the semiconductor stack of the UV LED contains a higher aluminum composition. In general, the shorter the wavelength, the higher the energy of the ultraviolet light-emitting diode, which requires a higher aluminum composition in the semiconductor stack. The UV LED with wavelength less than 280 nm, also known as deep-UV LED or UVC LED, requires a higher aluminum composition in the epitaxially grown semiconductor stack. The stress accumulated in the semiconductor stack with a high aluminum composition is more critical. The low epitaxial quality of the light-emitting element due to the stress is one of the problems to be solved in the industry.

SUMMARY

A method of manufacturing a light-emitting element is disclosed. The method includes: providing a substrate, wherein the substrate includes a top surface with a first area and a second area; introducing a semiconductor material to form a first layer on the first area and a second layer on the second area, wherein the first layer includes a first crystal quality and the second layer includes a second crystal quality, the first crystal quality is different from the second crystal quality; and dicing the substrate along the second area.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

FIGS. 1A-1H show a manufacturing method of a light-emitting element in accordance with an embodiment of the present application.

Figure 1A:
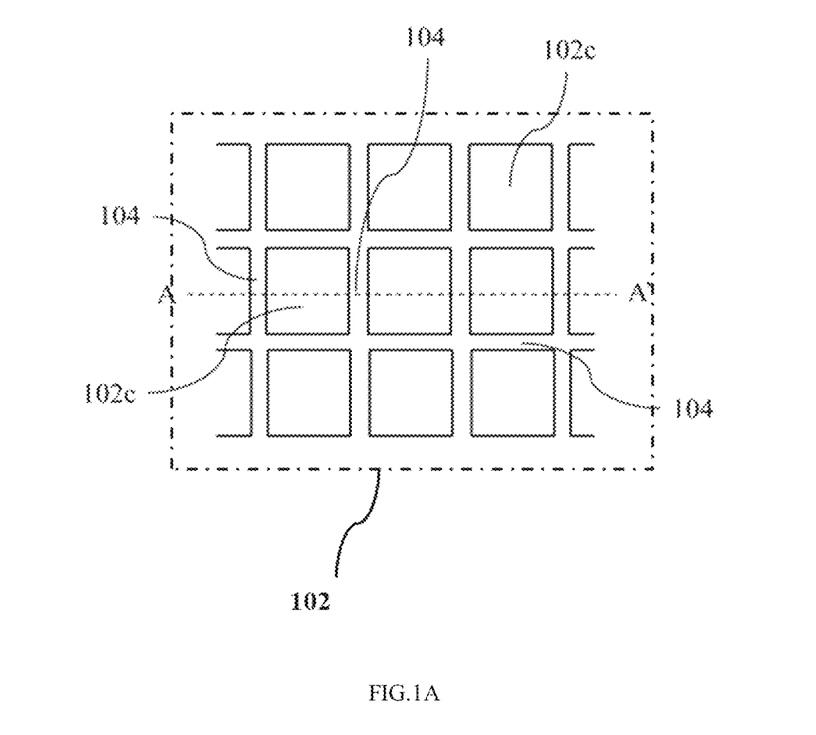
FIGS. 1A-1H show a manufacturing method of a light-emitting element in accordance with an embodiment of the present application.
Figure 1B:
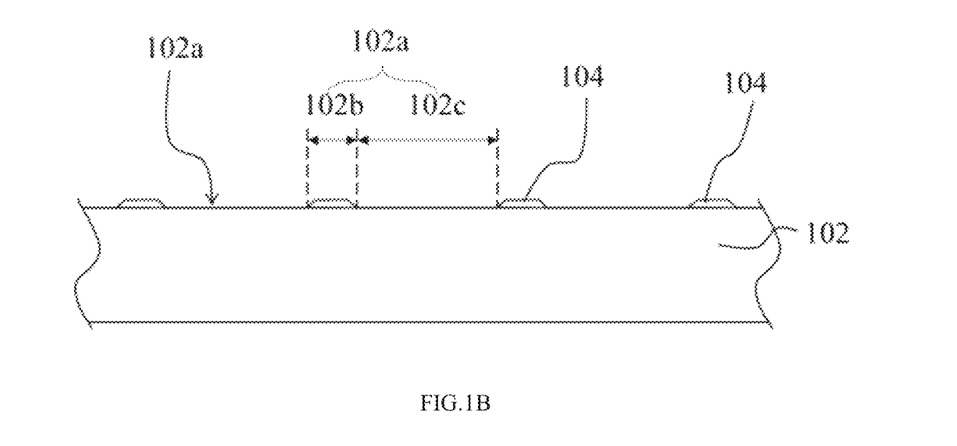

As shown in FIGS. 1A and 1B, the manufacturing method includes the steps of providing a substrate 102 and forming a patterned mask layer 104 on the substrate 102. FIG. 1A is a partial top view of the substrate 102 and the patterned mask layer 104, and FIG. 1B is a cross-sectional view taken along line A-A' of FIG. 1A. The substrate 102 is a substrate for epitaxial growth, such as sapphire, gallium nitride (GaN), silicon (Si) or silicon carbide (SiC) substrates. In the present embodiment, a sapphire substrate is used. In one embodiment, the substrate 102 can be a wafer that is cut from an ingot and is lapped, polished, and the like.

As shown in FIG. 1A and FIG. 1B, the substrate 102 has a top surface 102a. In one embodiment, dicing streets 102b and epitaxial growth areas 102c between the dicing streets 102b are defined first, then a dielectric layer is formed on the top surface 102a by deposition or evaporation, and finally the dielectric layer on the epitaxial growth areas 102c is selectively etched by photo-lithography or the like, and the dielectric layer on the dicing streets 102b is left to form the patterned mask layer 104. The material of the dielectric layer includes $SiO_2$ or $SiN_x$. In an embodiment, before forming the patterned mask layer 104, the epitaxial growth areas 102c are covered by a resist layer (not shown) and the dicing streets 102b are exposed, and then the dielectric layer is formed on the resist layer and the dicing streets 102b. Next, the resist layer is stripped so as to remove the dielectric layer thereon and the dielectric layer left on the dicing streets 102b forms the patterned mask layer 104. In one embodiment, the patterned mask layer 104 has a grid pattern with intersecting of a plurality of lines in a top view. Each of the epitaxial growth areas 102c located between the patterned mask layer 104 forms a rectangular pattern in the top view, as shown in FIG. 1A. In another embodiment, as shown in FIGS. 2A-2D, the epitaxial growth area 102c can be a strip pattern, a diamond pattern, a triangular pattern, a hexagonal pattern, or other polygonal pattern in the top view with different arrangements of patterns of the patterned mask layer 104. In one embodiment, each of the lines of the patterned mask layer 104 has a width of 10 μm to 100 μm in the top view and a height of 1 μm to 3 μm in the cross-sectional view.

Next, referring to FIG. 1C to FIG. 1F, an epitaxial stack is formed on the substrate 102. The epitaxial stack includes a semiconductor stack 101 corresponding to the epitaxial growth area 102c and a non-single crystalline semiconductor stack 101' corresponding the dicing street 102b. In one embodiment, the semiconductor stack 101 and the non-single crystalline semiconductor stack 101' are formed in the same step. The details are described as follows.

Figure 1C:
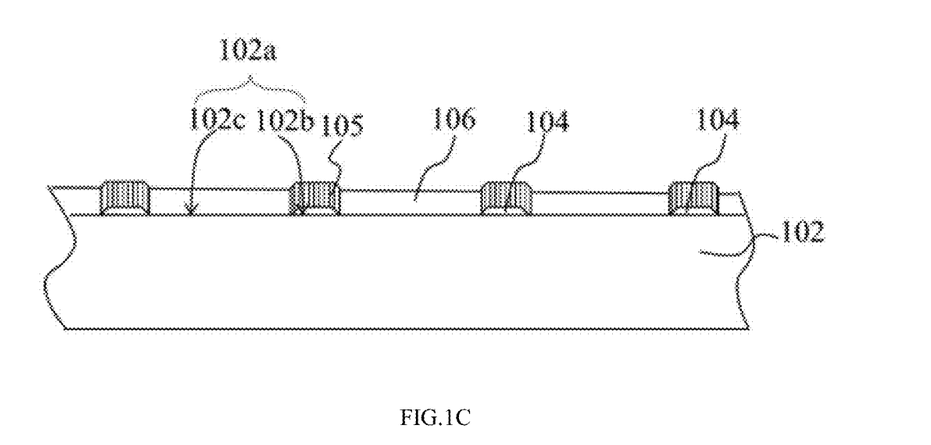

As shown in FIG. 1C, the method of manufacturing the light-emitting element includes a step of forming the buffer structure 106. The buffer structure 106 is formed on the plurality of epitaxial growth areas 102c of the substrate 102. The method of growing the buffer structure 106 includes a deposition method. The deposition includes epitaxy and physical vapor deposition (PVD). The epitaxy includes Molecular Beam Epitaxy (MBE), MOCVD, Vapor Phase Epitaxy (VPE) or Liquid Phase Epitaxy (LPE); physical vapor deposition method includes evaporation or sputtering. Depending on different conditions of the growth method, the buffer structure 106 includes a crystal structure with amorphous structure, poly-crystal or single crystal.

The buffer structure 106 includes AlN or AlGaN material and can be a single layer or a multilayer structure. In one embodiment, the buffer structure 106 includes an AlN layer and an $Al_{X1}Ga_{(1-X1)}N$ layer, where X1≥0.8. Since the patterned mask layer 104 is formed on the substrate 102, as the buffer structure 106 grows, the stress generated by the lattice mismatch between the buffer structure 106 and the substrate 102 (such as sapphire) progresses laterally rather than extends upward. Moreover, since the patterned mask layer 104 is located on the dicing streets 102b, a first non-single crystal layer 105, which includes non-single crystal structure, is formed over the dicing streets 102b and the patterned mask layer 104 in the same epitaxial growth step of the buffer structure 106. In one embodiment, after the substrate 102 is placed in the chamber of the MOCVD equipment (not shown), the aluminum, gallium, and nitrogen precursors are introduced into the chamber with the carrier gas, and the buffer structure 106 with an AlN layer followed by an AlGaN layer is formed on the epitaxial growth areas 102c of the top surface 102a of the substrate 102, and the first non-single crystal layer 105 is also formed on the patterned mask layer 104. In the embodiment, the first non-single crystal layer 105 and the buffer structure 106 are formed in the same epitaxial growth process and therefore the first non-single crystal layer 105 includes the same elements as those of the buffer structure 106. The first non-single crystal layer 105 includes polycrystalline or amorphous structure composed of aluminum, gallium, and nitrogen.

Figure 1D:
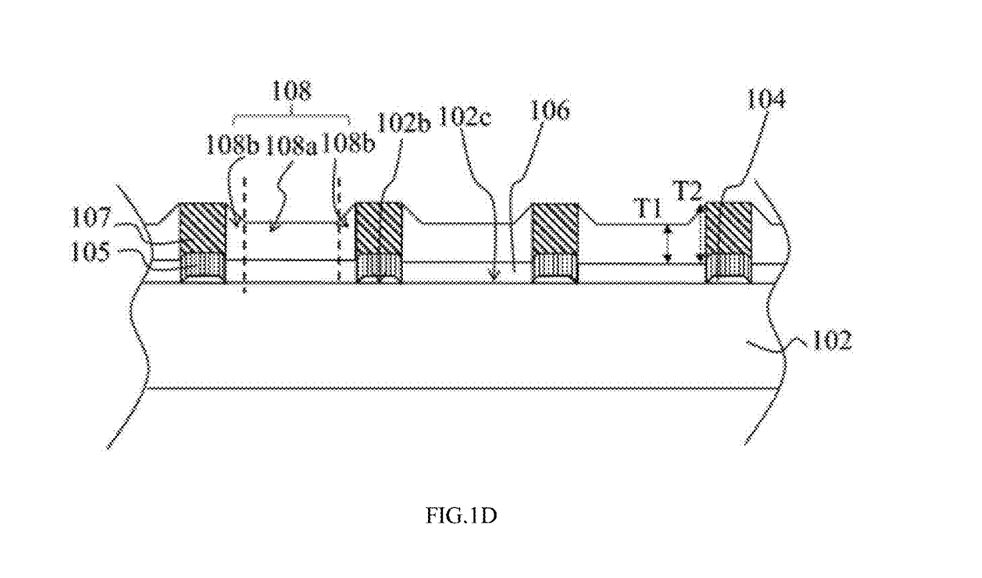
Figure 4A:
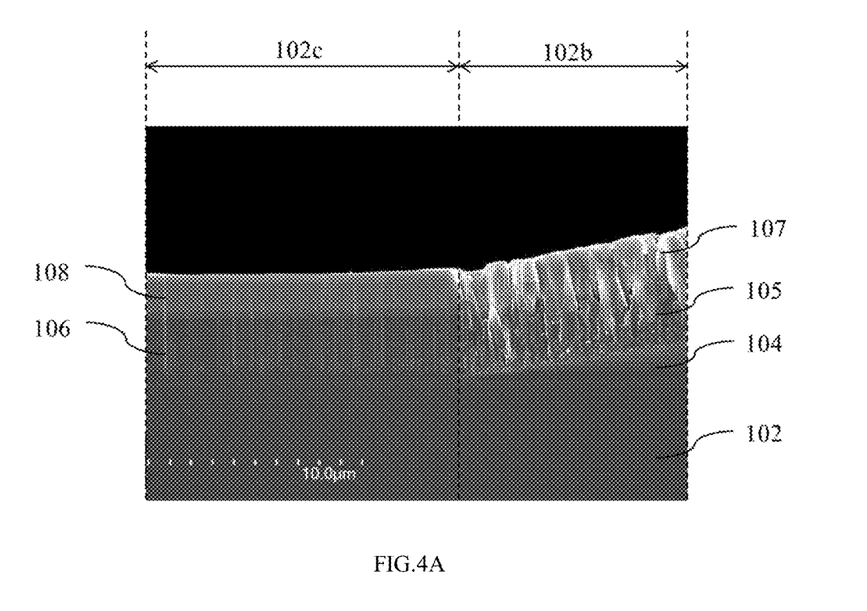
FIG. 4A shows a Scanning Electron Microscope (SEM) image of a light-emitting element in accordance with an embodiment of the present application.
Figure 4B:
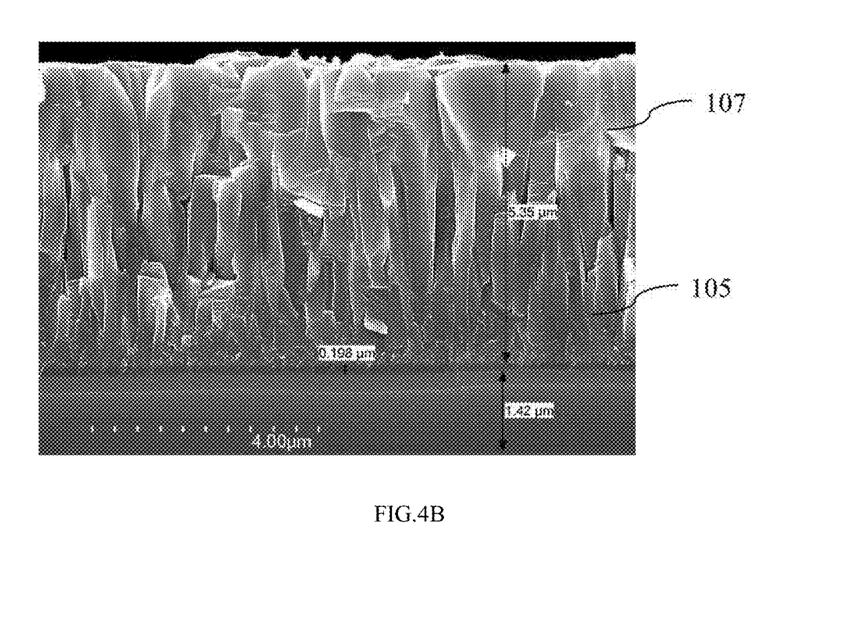
FIG. 4B shows a partial enlarged view of FIG. 4A.

As shown in FIG. 1D, after forming the buffer structure 106, a first semiconductor layer 108 is formed on the buffer structure 106 on each epitaxial growth area 102c by epitaxial growth, and at the same time, a second non-single crystal layer 107 is formed on the first non-single crystal layer 105. The first semiconductor layer 108 includes $Al_{X2}Ga_{(1-X2)}N$. The first semiconductor layer 108 can be doped with an impurity such as Si so that the first semiconductor layer 108 has a first conductivity type such as n-type. In one embodiment, X2 of the first semiconductor layer 108 is less than X1 in the buffer structure 106, and/or X2≥0.6. In the embodiment of MOCVD epitaxial growth, when forming the buffer structure 106 is completed, the flow rate or III/V ratio of the Al and Ga precursors into the chamber can be adjusted and impurities are also introduced into the chamber as well to form the first semiconductor layer 108 and the second non-single crystal layer 107 on the buffer structure 106 and the first non-single crystal layer 105, respectively. In the embodiment, since the first non-single crystal layer 105 is a polycrystalline or amorphous structure, the second non-single crystal layer 107 with a polycrystalline or amorphous structure is continuously grown thereon. The second non-single crystal layer 107 includes the same elements as the first semiconductor layer 108, for example, a polycrystalline or amorphous structure composed of aluminum, gallium, and nitrogen. FIG. 4A shows a SEM (Scanning Electron Microscope) image of a boundary region between the dicing street 102b and the epitaxial growth area 102c after the first semiconductor layer 108 is grown, and FIG. 4B shows a partial enlarged view of the first non-single crystal layer 105 and the second non-single crystal layer 107 of FIG. 4A. As shown in FIGS. 4A and 4B, the first non-single crystal layer 105 and the second non-single crystal layer 107 on the dicing street 102b are polycrystalline or amorphous. Compared with the first non-single crystal layer 105 and the second non-single crystal layer 107, the epitaxial quality of the buffer structure 106 and the first semiconductor layer 108 is better than that of the first non-single crystal layer 105 and the second non-single crystal layer 107. In one embodiment, the buffer structure 106 includes a single crystalline structure, a polycrystalline structure or a mixed structure of single crystal and poly-crystal. The first semiconductor layer 108 includes a single crystalline structure, a polycrystalline structure or a mixed structure of a single crystal and a poly-crystal.

As shown in FIG. 1D, each of the first semiconductor layers 108 includes a first region 108a away from the dicing streets 102b and a second region 108b adjacent to the dicing streets 102b; wherein the first region 108a has a first thickness T1 and the second region 108b has a second thickness T2 greater than the first thickness T1. In one embodiment, when the patterned mask layer 104 is formed on the substrate 102 corresponding to the dicing streets 102b as shown in FIG. 1A, that is, when each epitaxial growth area 102c is surrounded by the pattern mask layer 104, the second region 108b is formed on the epitaxial growth area 102c along the boundary of the epitaxial growth area 102c and close to the patterned mask layer 104. Therefore, the first region 108a is also surrounded by the second region 108b. The ratio of the area of the second region 108b to the area of the epitaxial growth area 102c is more than 0% and less than 50%, and the first region 108a has a substantially uniform first thickness T1.

In one embodiment, the second thickness T2 of the second region 108b increases from the first thickness T1 in direction from the first region 108a toward the periphery of the first semiconductor layer 108, that is, toward the dicing streets 102b. The second region 108b has a gradient and the second thickness T2 is a gradient thickness. In another embodiment, the thickness T2 of the second region 108b increases from the first thickness T1 from the first region 108a and then substantially remains a constant thickness. In another embodiment, the second thickness T2 increases by five to ten percent than the first thickness T1. After forming the first semiconductor layer 108, it can be observed by an X-ray Diffraction (XRD) that the surface of the first semiconductor layer 108 is smooth.

Figure 1E:
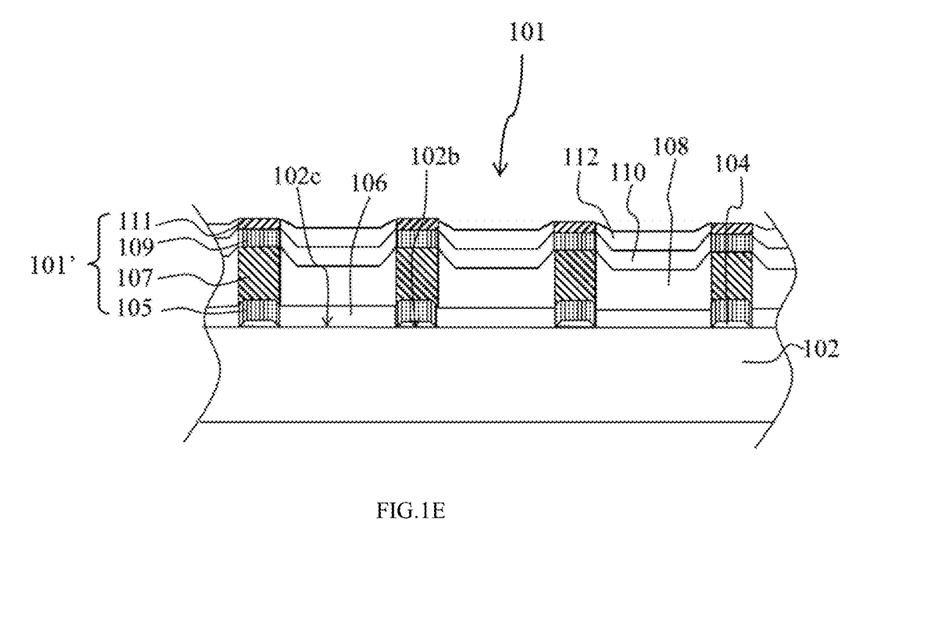

As shown in FIG. 1E, an epitaxial process is performed on the first semiconductor layer 108 on each epitaxial growth area 102c and the second non-single crystal layer 107 on the patterned mask layer 104. In this epitaxial process, a light-emitting stack 110 and a second semiconductor layer 112 are sequentially formed on the first semiconductor layer 108. The second non-single crystal layer 107 is disadvantageous for forming high quality single crystalline epitaxy layer; thus, in this epitaxial process, a third non-single crystal layer 109 and a fourth non-single crystal layer 111 which respectively have the same material as the light-emitting stack 110 and the second semiconductor layer 112 are formed on the second non-single crystal layer 107. In one embodiment, the light-emitting stack 110 includes a single heterostructure (SH), a double heterostructure (DH), a double-side double heterostructure (DDH) or a multiple quantum well structure (multi-quantum well, MQW). When the light-emitting stack 110 includes AlInGaP, it emits a red light with a dominant wavelength between 610 nm and 650 nm or a green light with a dominant wavelength between 530 nm and 570 nm. When the light-emitting stack 110 includes InGaN, it emits a blue light with a dominant wavelength between 400 nm and 490 nm. When the light-emitting stack 110 includes AlN, AlGaN or AlInGaN, it emits blue-violet or invisible ultraviolet light with wavelengths between 400 nm and 250 nm. The III-V semiconductor materials is not limited to what described above, and other materials can be selected to generate non-visible light in other wavelength bands, such as infrared light or far infrared light. The light-emitting stack 110 includes an undoped semiconductor, a p-type semiconductor, or an n-type semiconductor. The second semiconductor layer 112 can include an AlGaN layer. The second semiconductor layer 112 may be doped with an impurity such as Mg to have a second conductivity type such as p-type. In an embodiment, the second semiconductor layer 112 includes a plurality of sub-layers, and the Al compositions in each sub-layer are different and the doping concentrations therein are also different. For example, the doping concentration gradually increases from the side of the light-emitting stack 110 along the epitaxial growth direction of the second semiconductor layer 112. In one embodiment, since the second non-single crystal layer 107 is a polycrystalline or amorphous structure, the third non-single crystal layer 109 and the fourth non-single crystal layer 111 stacked thereon are also polycrystalline or amorphous structures. The third non-single crystal layer 109 and the fourth non-single crystal layer 111 have the same material as the light-emitting stack 110 and the second semiconductor layer 112, respectively. The light-emitting stack 110 and the second semiconductor layer 112 include an AlGaN layer, for example, an AlGaN layer with single crystal structure. In one embodiment, the Al composition in the light-emitting stack 110 is lower than that in the first semiconductor layer 108, and the Al composition in the second semiconductor layer 112 is lower than that of the light-emitting stack 110.

Figure 1F:
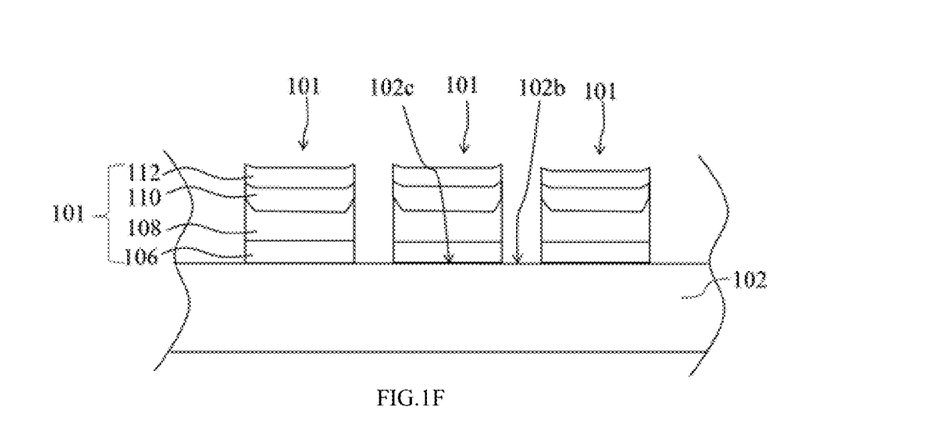

As shown in FIG. 1F, after forming the second semiconductor layer 112, the non-single crystal stack 101' on the patterned mask layer 104 is removed to define a plurality of semiconductor stacks 101 on the substrate 102. The method of removing the non-single crystal stack 101' includes removing the first to the fourth non-single crystal layers 105, 107, 109 and 111, and the patterned mask layer 104. In another embodiment, the first to the fourth non-single crystal layers 105, 107, 109 and 111 are removed while the patterned mask layer 104 stays on the substrate 102. In the subsequent process, each semiconductor stack 101 forms an individual light-emitting element. In one embodiment, each semiconductor stack 101 includes the buffer structure 106 formed on the substrate, the first semiconductor layer 108 formed on the buffer structure 106, the light-emitting stack 110 formed on the first semiconductor layer 108, and the second semiconductor layer 112 formed on the light-emitting stack 110. In this embodiment, the non-single crystal stack 101' and the patterned mask layer 104 are removed by dry etching (e.g., inductively coupled plasma (ICP) etching) or dry etching with wet etching.

Figure 1G:
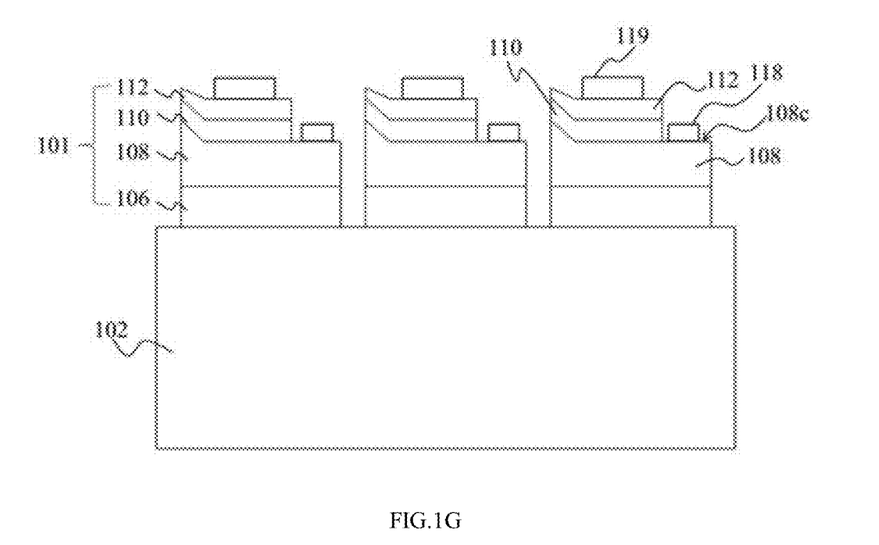

As shown in FIG. 1G, after forming the plurality of semiconductor stacks 101, a portion of the second semiconductor layer 112 and the light-emitting stack 110 of each of the semiconductor stacks 101 are removed by, for example, dry etching and/or wet etching, to form a platform 108c to expose a portion of the first semiconductor layer 108. In one embodiment, the platform 108c is located at an edge of the semiconductor stack 101. In one embodiment, a portion of the second region 108b of the first semiconductor layer 108 is also etched away when the platform 108c is formed. In another embodiment, the platform 108c is located in an interior region of the semiconductor stack 101. The second region 108b of the first semiconductor layer 108 is not etched away, and the second region 108b surrounds the platform 108c.

Then, a first electrode 118 such as a metal electrode is formed on the platform 108c and a second electrode 119 such a metal electrode is formed on the second semiconductor layer 112. In one embodiment, the step of removing the patterned mask layer 104 and the non-single crystal stack 101' in FIG. 1F is performed after forming the platform 108c and the electrodes of FIG. 1G.

In another embodiment of the present application, a contact layer (not shown) is further included between the first semiconductor layer 108 and the first electrode 118, and/or between the second semiconductor layer 112 and the second electrode 119. The material of the contact layer includes metal or metal oxide. The metal material includes silver (Ag), aluminum (Al), gold (Au), titanium (Ti), copper (Cu), platinum (Pt), nickel (Ni), rhodium (Rh), an alloy of the above materials or a stack of the above materials. The metal oxide material includes indium tin oxide (ITO), zinc oxide (ZnO), indium oxide (InO), tin oxide (SnO), indium zinc oxide (IZO), zinc gallium oxide (GZO), or a stack of the above materials.

Figure 1H:
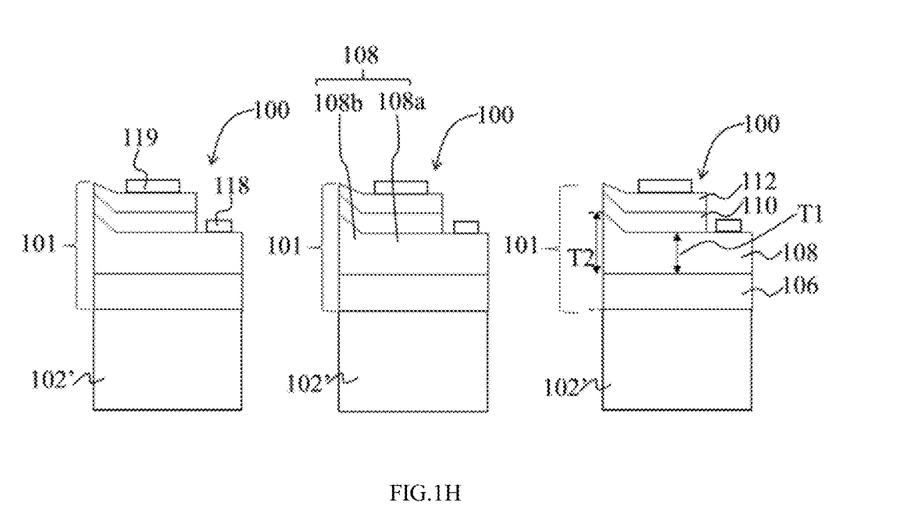
Figure 2A:
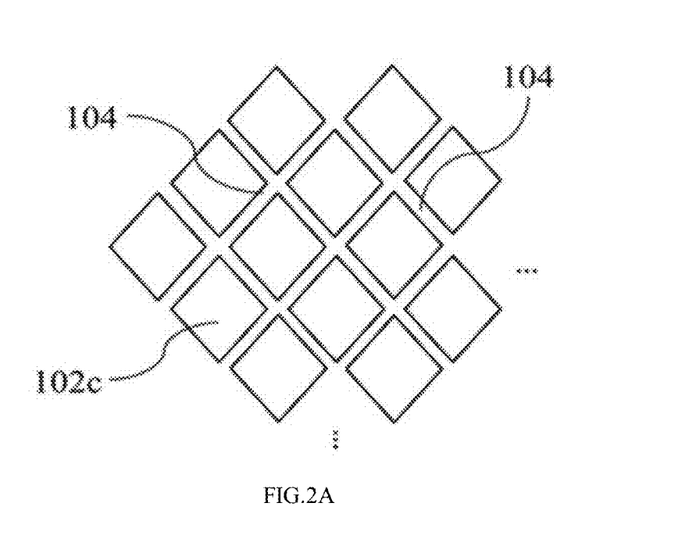
FIGS. 2A-2D show a top view of a patterned mask layer and a substrate in accordance with different embodiments of the present application.
Figure 2B:
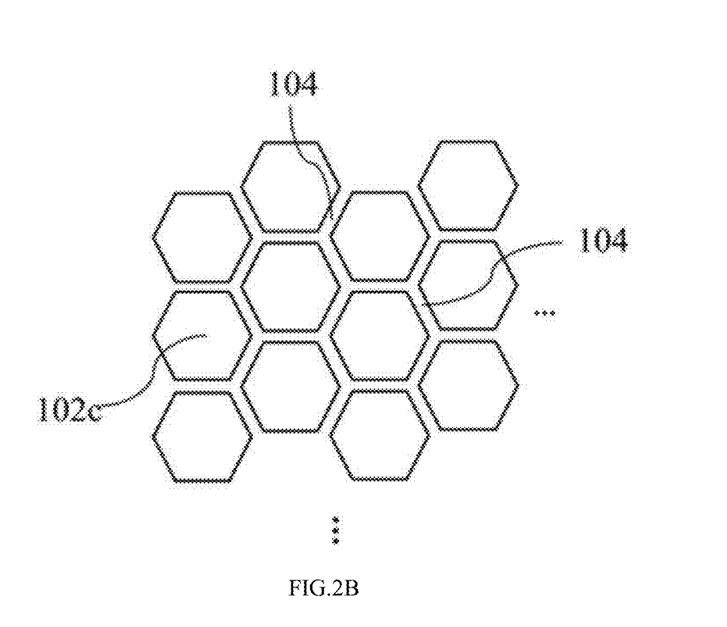
Figure 2C:
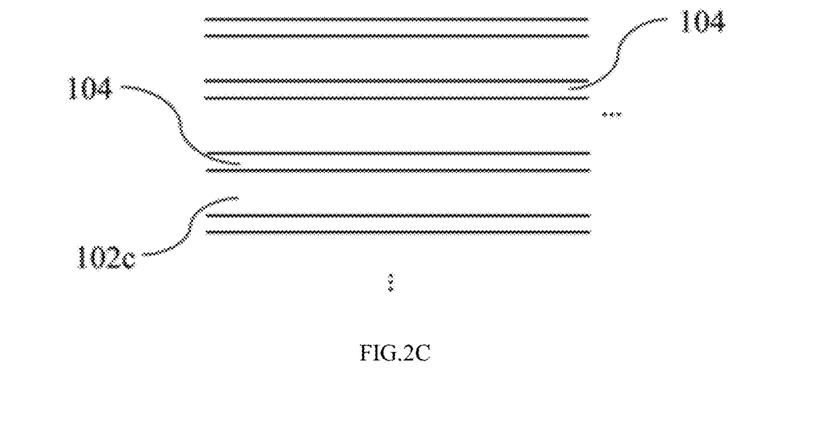
Figure 2D:
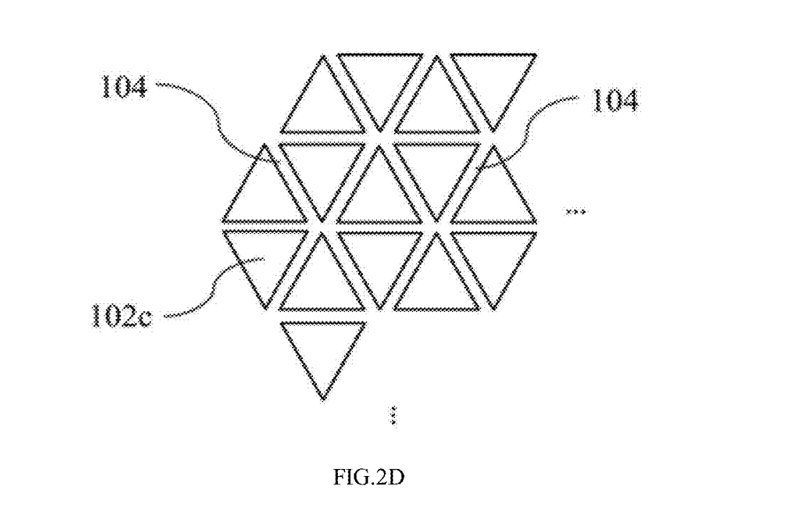

As shown in FIG. 1H, a substrate dicing step is performed. The substrate dicing step includes irradiating a laser along the dicing street 102b from the top surface 102a of the substrate to scribe the substrate 102 from the top surface 102a into the substrate 102, or focusing a stealth dicing laser on an interior of the substrate 102 to form a modification area (not shown) inside the substrate 102. The above substrate dicing step can be combined with a splitting method which splits the substrate along the lattice surface of the substrate in the modification area. In this embodiment, the substrate 102 is separated by a stealth dicing laser along the position corresponding to the dicing street 102b to form a plurality of light-emitting elements 100, and each of the light-emitting elements 100 includes a substrate 102' and the semiconductor stack 101 on the substrate 102'.

In one embodiment, the light-emitting element 100 emits a light having a dominant wavelength of ultraviolet light. An ultraviolet light-emitting element 100 with high epitaxial quality can be obtained in accordance with aforementioned process and structure in the above embodiments.

The light-emitting element 100 has a periphery. The first semiconductor layer 108 has the first thickness T1 in an inner region (i.e. the first region 108a) away from the periphery of the light-emitting element 100. An edge of the first semiconductor layer 108 near the periphery of the light-emitting element 100 (i.e. the second region 108b) has the second thickness T2, and the second thickness T2 is greater than the first thickness T1. The second thickness T2 has a gradient. In one embodiment, the gradient thickness gradually increases from the inner region of the first semiconductor layer 108 to the periphery. In one embodiment, the first thickness T1 gradually increases from the inner region. In another embodiment, the thickness T2 of the second region 108b increases from the inner region and then remains substantially constant. In another embodiment, the second thickness T2 increases by five to ten percent than the first thickness T1.

As shown in FIG. 1H, the layers above the first semiconductor layer 108 have different heights and/or thicknesses corresponding to the inner region and the edge of the first semiconductor layer 108. In another embodiment, as the layers above the first semiconductor layer 108 are epitaxially growing, the height difference of the above layers due to the thicknesses difference between the inner region and the edge of the first semiconductor layer 108 is gradually decreased, so that the top surface of the second semiconductor layer 112 eventually becomes flat (not shown).

Figure 3:
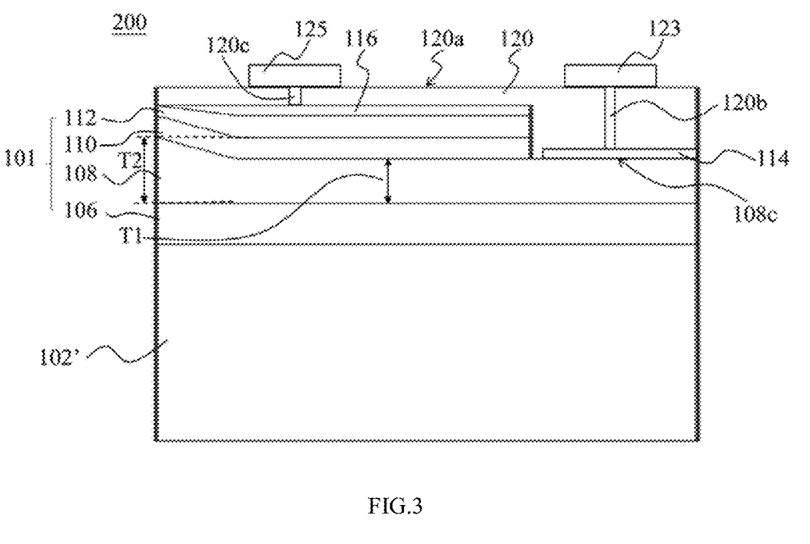
FIG. 3 shows a cross-sectional view of a light-emitting element in accordance with another embodiment of the present application.

FIG. 3 is a cross-sectional view showing a light-emitting element 200 in accordance with another embodiment.

The light-emitting element 200 includes: a substrate 102'; a semiconductor stack 101 formed on the substrate 102' and including a buffer structure 106, which can be a single layer or a multilayer structure, formed on the substrate 102'; a first semiconductor layer 108 having a first conductivity type formed on the buffer structure 106, wherein the first semiconductor layer 108 includes $Al_{X2}Ga_{(1-X2)}N$; a light-emitting stack 110 formed on the first semiconductor layer 108; and a second semiconductor layer 112 having a second conductivity type formed on the light-emitting stack 110. In the cross-sectional view, the inner region of the first semiconductor layer 108 away from the periphery of the light-emitting element 200 has a first thickness T1. The edge of the first semiconductor layer 108 near the periphery of the light-emitting element 200 has a second thickness T2 greater than T1. The second semiconductor layer 112 and the light-emitting stack 110 are partially removed to form a platform 108c exposing a portion of the first semiconductor layer 108. A first contact layer 114 is formed on the first semiconductor layer 108. In an embodiment, a second contact layer 116 is formed on the second semiconductor layer 112 and covers the top surface of the second semiconductor layer 112. The first contact layer 114 and/or the second contact layer 116 include metal or metal oxide. The metal material of the second contact layer 116 includes silver (Ag), aluminum (Al), gold (Au), titanium (Ti), copper (Cu), platinum (Pt), nickel (Ni), rhodium (Rh), or an alloy of the above materials or a stack of the above materials. The metal oxide material of the second contact layer 116 includes indium tin oxide (ITO), zinc oxide (ZnO), indium oxide (InO), tin oxide (SnO), indium zinc oxide (IZO), zinc gallium oxide (GZO), or a stack of the above materials. The material of the first contact layer 114 and/or the second contact layer 116 includes graphene. The first contact layer 114 or the second contact layer 116 can be a single layer or a multilayer structure, and the multilayer structure includes a metal layer, a metal oxide layer, or a stack of the above materials. Since there is ohmic contact between the first contact layer 114 and the first semiconductor layer 108 and/or between the second contact layer 116 and the second semiconductor layer 112, and the contact layers have low resistance, current can be easily injected into the light-emitting element and then uniformly spread in the light-emitting element. Moreover, metal material with high reflectance can be selected as the material of the first contact layer 114 and/or the second contact layer 116 such that the second contact layer 116 has a high reflectance to the light emitted by the light-emitting stack 110. In one embodiment, the second contact layer 116 includes an indium tin oxide layer and a silver layer. An omni-directional reflector (ODR) is formed by the transmittance of the indium tin oxide layer and its refractive index different from that of the semiconductor stack and together with the high reflectance of the silver layer. The first contact layer 114 includes a metal layer or a stack of metal layers, such as a stack of Cr and Al.

The light-emitting element 200 includes a dielectric layer 120 covering the second contact layer 116 and the first contact layer 114. The dielectric layer 120 has a top surface 120a, a first opening 120b, and a second opening 120c. A first metal electrode 123 is disposed on the top surface 120a of the dielectric layer 120 and filled into the first opening 120b to electrically connect to the first contact layer 114 through the first opening 120b. A second metal electrode 125 is disposed on the top surface 120a and filled in the second opening 120c to electrically connect to the second contact layer 116 through the second opening 120c.

The manufacturing method of the light-emitting element 200 is similar with that of the foregoing embodiment. The difference is that the contact layer 114 and 116 are respectively formed on the first semiconductor layers 108 and the second semiconductor layer 112, and then the dielectric layer 120 is formed to cover the semiconductor stack 101. The first opening 120b and the second opening 120c are formed in the dielectric layer 120, and the first metal electrode 123 and the second metal electrode 125 are formed on the top surface 120a.

The dielectric layer 120 can be a single layer or a multilayer structure. In one embodiment, the dielectric layer 120 includes a multilayer structure with two or more materials having different refractive indices alternately stacked to form a distribute Bragg reflector (DBR), and thereby selectively reflecting light within specific wavelength range.

In another embodiment, a carrier (not shown) is provided. A surface side of the carrier includes a first electrical connection region electrically connected to the first metal electrode 123 and a second electrical region electrically connected to the second metal electrode 125.

In another embodiment, when the light-emitting element 200 is electrically connected to a carrier (not shown) and fixed to the carrier, the substrate 102' is removed by etching or laser lift-off, etc. When the light-emitting stack 101 emits light with a wavelength of ultraviolet light, the efficiency of the light-emitting element 200 may be lowered because the substrate 102' absorbs ultraviolet light. By removing the substrate 102', the efficiency of the light-emitting element 200 is improved.

In addition to the above embodiments, the light-emitting element includes a plurality of semiconductor stacks electrically connected with each other. As shown in FIG. 1G, side surfaces of each semiconductor stack 101 are covered by an insulating layer (not shown), or a dielectric material (not shown) may be filled between the semiconductor stacks 101, and then a plurality of wires (not shown) formed on the insulating layer or the dielectric material to connect the first electrode 118 and/or the second electrode 119 of the adjacent semiconductor stacks 101. As a result, the plurality of semiconductor stacks 101 is electrically connected in series or in parallel.

In a conventional light-emitting element with an AlGaN layer which contains high Al composition and epitaxially grows on a sapphire substrate, the surface of the AlGaN layer is rough due to lattice mismatch and therefore the efficiency of the light-emitting element is lowered. Compared with the conventional art, in the manufacturing method of the light-emitting element in accordance with any embodiments of the present application, epitaxial growth areas and dicing streets are firstly defined on the substrate, and a patterned mask layer is formed on the dicing streets, followed by epitaxy processes on the epitaxial growth area and the patterned mask layer. The stress caused by the lattice mismatch between the AlGaN layer (e.g. the first semiconductor layer 108 and semiconductor layers thereon) and the substrate is laterally alleviated. In addition, by the manufacturing method of the light-emitting element in the present application, the growth rate and cost of epitaxial growth can be saved.

It will be apparent to those having ordinary skill in the art that various modifications and variations can be made to the elements in accordance with the present application without departing from the scope or spirit of the disclosure. In view of the foregoing, it is intended that the present disclosure covers modifications and variations of this disclosure provided they fall within the scope of the following claims and their equivalents.

What is claimed is:

1. A method of manufacturing a light-emitting element, comprising:
   providing a substrate, wherein the substrate comprises a top surface with a first area and a second area;
   introducing a semiconductor material to form a first layer on the first area and a second layer on the second area, wherein the first layer comprises a first crystal quality and the second layer comprises a second crystal quality, the first crystal quality is different from the second crystal quality; and
   dicing the substrate along the second area.

2. The method of claim 1, further comprising forming a patterned mask layer on the second area.

3. The method of claim 2, wherein the patterned mask layer has a width of 10 µm to 100 µm.

4. The method of claim 2, wherein the patterned mask layer has a height of 1 µm to 3 µm.

5. The method of claim 2, wherein the second layer is formed on the patterned mask layer.

6. The method of claim 1, wherein the second layer comprises a first non-single crystal semiconductor layer.

7. The method of claim 6, further comprising forming a non-single crystal semiconductor stack on the first non-single crystal semiconductor layer.

8. The method of claim 7, further comprising removing the non-single crystal semiconductor stack before dicing the substrate.

9. The method of claim 7, further comprising:
   forming a patterned mask layer on the second area;
   forming the first non-single crystal semiconductor layer and the non-single crystal semiconductor stack on the patterned mask layer; and
   removing the patterned mask layer before dicing the substrate.

10. The method of claim 7, wherein the first layer comprises a buffer structure on the first area.

11. The method of claim 10, wherein the buffer structure comprises $Al_{X2}Ga_{(1-X2)}N$, and wherein $X2 \geq 0.8$.

12. The method of claim 10, further comprising forming a first semiconductor layer, a light-emitting stack and a second semiconductor layer on the buffer structure.

13. The method of claim 12, further comprising:
   removing portions of the second semiconductor layer and the light-emitting stack to form a platform exposing a portion of the first semiconductor layer;
   forming a first contact layer on the platform to electrically connect to the first semiconductor layer; and
   forming a second contact layer on the second semiconductor layer.

14. The method of claim 12, wherein the first semiconductor layer comprises $Al_{X1}Ga_{(1-X1)}N$, wherein $X1 \geq 10.6$.

15. The method of claim 12, wherein the first semiconductor layer comprises $Al_{X1}Ga_{(1-X1)}N$ and the buffer structure comprises $Al_{X2}Ga_{(1-X2)}N$, and wherein $X2 > X1$.

16. The method of claim 12, wherein the first semiconductor layer comprises a first region and a second region surrounding the first region and closer to the second area than the first region; and wherein the first region comprises a first thickness, and the second region comprises a second thickness larger than the first thickness.

17. The method of claim 1, wherein the second area is a dicing street, and the step of dicing the substrate comprises dicing the substrate along the dicing street.

18. The method of claim 1, wherein in a top view, the second area surrounds the first area.

19. The method of claim 1, wherein the first crystal quality is better than the second crystal quality.

20. The method of claim 12, wherein one of the first semiconductor layer and the second semiconductor layer comprises a single crystal structure.

* * * * *